United States Patent [19]

Tobita

[11] Patent Number: 4,788,664
[45] Date of Patent: Nov. 29, 1988

[54] WORD LINE DRIVE CIRCUIT

[75] Inventor: Youichi Tobita, Itami, Japan

[73] Assignee: Mitsubishi Denki Kabushiki Kaisha, Tokyo, Japan

[21] Appl. No.: 909,938

[22] Filed: Sep. 22, 1986

[30] Foreign Application Priority Data

Dec. 10, 1985 [JP] Japan .............................. 60-278655

[51] Int. Cl.$^4$ ............................................. G11C 13/00
[52] U.S. Cl. ................................... 365/189; 365/226; 365/203; 365/230
[58] Field of Search .............. 365/189, 230, 226, 184, 365/149, 203

[56] References Cited

FOREIGN PATENT DOCUMENTS 0089836 9/1983 European Pat. Off. .
3307756 9/1983 Fed. Rep. of Germany .

OTHER PUBLICATIONS

Ishihara et al., (no title), 1985. 2.11 Nikkei Electronics 243 (1985).
Chan et al.,; "A 100 ns 5V only 64K×1 MOS Dynamic RAM"; IEEE Journal of Solid State Circuits; vol. SC-15, No. 5; Oct., 1980; pp. 839-846.
Tamguchi et al.; "Fully Boosted 64K Dynamic RAM With Automatic and Self-Refresh"; IEEE Journal of Solid State Circuits; vol. SC-16, No. 5; Oct., 1981; pp. 492-498.
"Translation of An Official Action"; German Patent Office; May 7, 1987; German patent Application No. P 36 35 344.2.

Primary Examiner—Terrell W. Fears
Attorney, Agent, or Firm—Saidman, Sterne, Kessler & Goldstein

[57] ABSTRACT

In a word line drive circuit providing a word line drive signal for a random access memory, the drive signal has a smooth rising curve to attain a high data reading speed. The circuit comprises two FETs which are series connected between a terminal at which an internally boosted voltage is provided and the ground. The drive signal is provided from the junction of the two FETs. A voltage of the control signal is increased by a boosting capacitor to a level sufficient to keep the FET (connected to the boosted voltage terminal) nonconductive until production of the drive signal is desired. The resultant drive signal has an inverse phase to the phase of the control signals.

11 Claims, 8 Drawing Sheets

WORD LINE DRIVE CIRCUIT

BACKGROUND OF THE INVENTION

The present invention relates to an improvement in a word line drive circuit for a random access memory employing field effect transistors.

Figure 1:
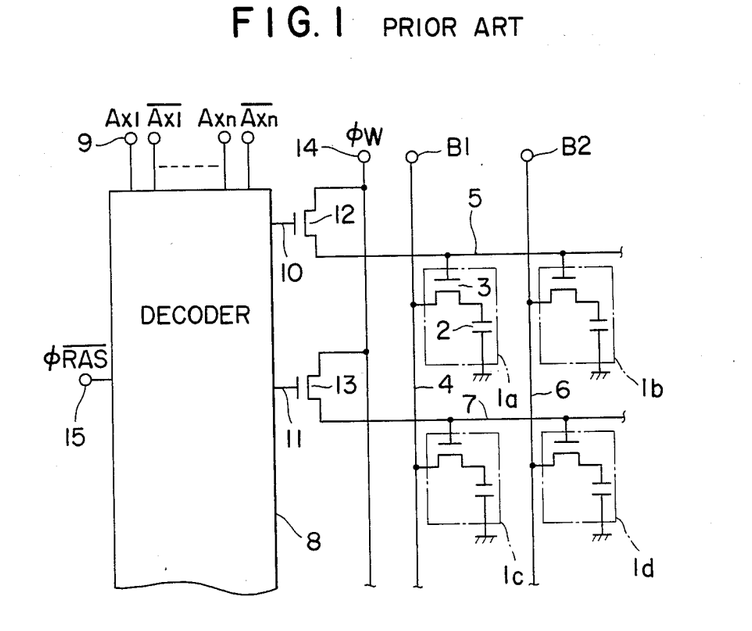
FIG. 1 shows a part of a prior art type random access memory.

FIG. 1 shows a part of a prior art random access memory (hereinafter referred to as RAM), having memory cells arranged in rows and columns to form a matrix. The memory cells in the same column are connected to a common bit line which transmits data read from or written into the memory cells connected thereto. The memory cells in the same row are connected to a common word line which transmits a signal for controlling a switching field effect transistor (hereinafter referred to to as FET) provided within each of the memory cells connected thereto.

Each of the memory cells, such as 1a through 1d stores one bit data of a logical "1" or a logical "0" (hereinafter simply referrerd to as "1" or "0"). Each of the memory cells comprises a storage capacitor 2 with one electrode grounded, and a switching FET 3 with one main electrode connected to the other electrode of the storage capacitor 2. The storage capacitor 2 contains data of "1" or "0", and the switching FET 3 is used for reading, writing or holding data from or in the storage capacitor 2. The other main electrode of the switching FET 3 is connected to one of the bit lines 4, 6, etc. (only 4 and 6 being illustrated), which transmits data for the memory cells. The gate of the switching FET 3 is connected to one of the word lines 5, 7, etc. (only 5 and 7 being illustrated), which transmits a signal for controlling ON/OFF operation of the switching FET 3. A decoder 8 decodes address signals $Ax_1$, $\overline{Ax_1}$, - - - $Ax_n$, $\overline{Ax_n}$ (hereinafter generalized as Ax, $\overline{Ax}$) provided through terminals 9, and supplies a voltage to one of output lines 10, 11, etc. (only 10 and 11 being illustrated). FETs 12, 13, etc. (only 12 and 13 being illustrated) connect the word lines 5, 7, etc. (only 5 and 7 being illustrated) with a terminal 14, depending on the voltaghe levels on the output lines 10, 11, etc. respectively. On the terminal 14, a word line drive signal $\phi w$ is provided. A terminal 15 is an input terminal for a clock signal $\phi \overline{RAS}$. In the following description, it is assumed that there are only four memory cells 1a through 1d, two word lines and two bit lines.

Figure 2:
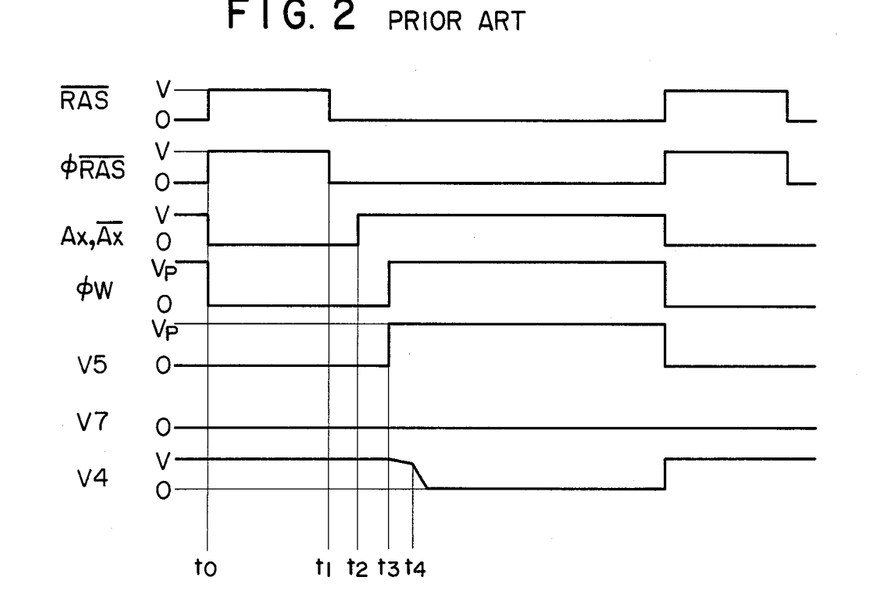
FIG. 2 is a timing chart illustrating operation of the memory shown is FIG. 1.

FIG. 2 is a timing chart illustrating read operation of the circuit shown in FIG. 1. Here, it is assumed that data "0" is read from the memory cell 1a. In FIG. 2, the period from the time t0 to the time t1 is a precharge period, and in this period the output line 10 and 11 of the decoder 8 are precharged to be "1" by an internal clock signal $\phi \overline{RAS}$ which is in phase with an external clock signal $\overline{RAS}$ (Row Address Strobe). During this precharge period, a voltage V5 on the word line 5 and a voltage V7 on the word line 7 are at "0", because the word line drive signal $\phi w$ is at "0". At the time t1, the clock $\phi \overline{RAS}$ becomes "0", after which external address signals are taken in. Then, at the time t2, internal address signals Ax, $\overline{Ax}$ are inputted to the decoder 8. Supposing that the word line 5 is selected, for example, the voltage level on the node 11 is turned to "0", while the voltage level on the node 10 is kept at "1". At the time t3, the word line drive signal $\phi w$ is turned from "0" to "1", and this signal is transmitted to the word line 5 through the FET 12, which is conductive due to the node 10 being at "1", so that the voltage on the word line 5 is turned from "0" to "1". As a result, the FETs 3 in the memory cells 1a and 1b are turned on, so that data in the memory cells 1a and 1b are read out on to the bit lines 4 and 6. Reading data on to a bit line causes a minute voltage change on the bit line. After that, at the time t4, the minute voltage change is amplified by an amplifier circuit (not shown) connected to the same bit line.

To increase the speed of the reading from the memory cells, a voltage supplied to the word lines is usually set higher than a power supply voltage for the circuit. Raising the voltage on the word lines is effective because it lowers the ON resistance of the FETs 3.

Figure 3:
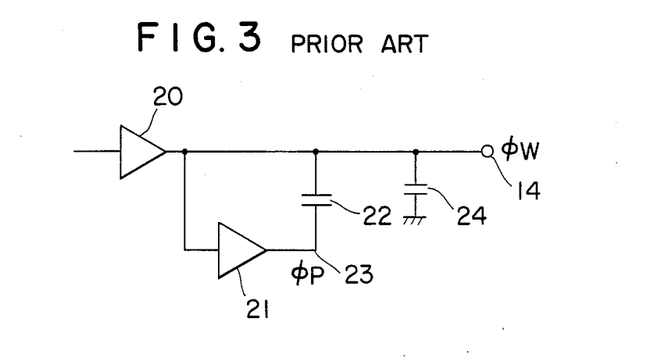
FIG. 3 shows an example of a prior art word line drive circuit.

FIG. 3 shows an example of a word line drive circuit in which a voltage higher than a power supply voltage is supplied to word lines, which comprises a signal generator 20 producing a word line drive signal $\phi w$, a signal generator 21 producing a boosting signal $\phi p$, a boosting capaciter 22 which is connected between the output terminal 14 for the word line drive signal $\phi w$ and the output terminal 23 for the boosting signal $\phi p$, and a parasitic capacitance element 24 between the output terminal 14 and the ground.

Figure 4:
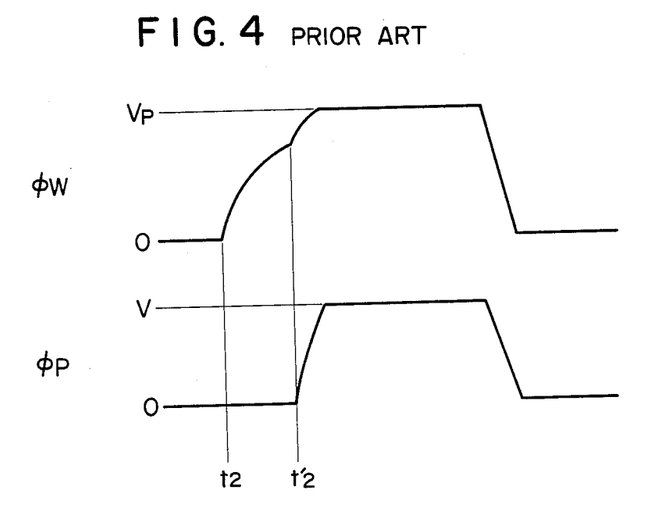
FIG. 4 is a timing chart illustrating the operation of the circuit shown in FIG. 3.

FIG. 4 is a timing chart illustrating operation of the circuit shown in FIG. 3. The output terminal 14 in FIG. 3 corresponds to the terminal 14 in FIG. 1 and the drive signal $\phi w$ is transmitted to the word line 5. After the drive signal $\phi w$ increases from "0" to "1" at the time t2, the boosting signal $\phi p$ increases from "0" to "1" at the time t2', so that the voltage level of the signal $\phi w$ increases to a value Vp higher than V because of the boosting capacitor 22. The voltage increment $\Delta V$ is given by $$\Delta V = \{C22/(C22+C24)\}V,$$

where C22 and C24 are capacitances of the capacitors 22 and 24, respectively.

However, the word line drive circuit described above has the following problem. As illustrated in FIG. 4, the drive signal $\phi w$ is increased from "0" to "Vp". But, the increasing curve is not smooth and has a step at the time t2'. The decrease of the ON resistance of the FET 3 is in step with this curve, so that the speed of reading data from a memory cell is not high enough for certain applications. Although the increasing curve of $\phi w$ can be smoothed by advancing the rising time t2' of the signal $\phi p$, this lowers the ultimate voltage Vp because the boosting is started when $\phi w$ is still low. As a result, reading speed is limited.

SUMMARY OF THE INVENTION

An object of this invention is to provide a word line drive circuit for a random access memory which generates a drive signal having a smooth rising curve to attain a high speed of reading data from a memory cell.

According to the invention there is provided a drive circuit comprising a first FET and a second FET which are connected in series and between a first power supply terminal and a second power supply terminal, a junction of said first FET and said second FET being connected to an output terminal which provides a drive signal, and said first FET having an opposite conductivity to said second FET, a boosting capacitor having a first electrode connected to a gate of said first FET and a second electrode connected to a first node to which a first control signal is supplied, and drive means which generates a second control signal and supplies said second control signal to said gate of said first FET, said first control signal and said second control signal having an inverse phase to the phase of said drive signal.

DETAILED DESCRIPTION OF THE PREFERRED EMBODIMENTS

Figure 5:
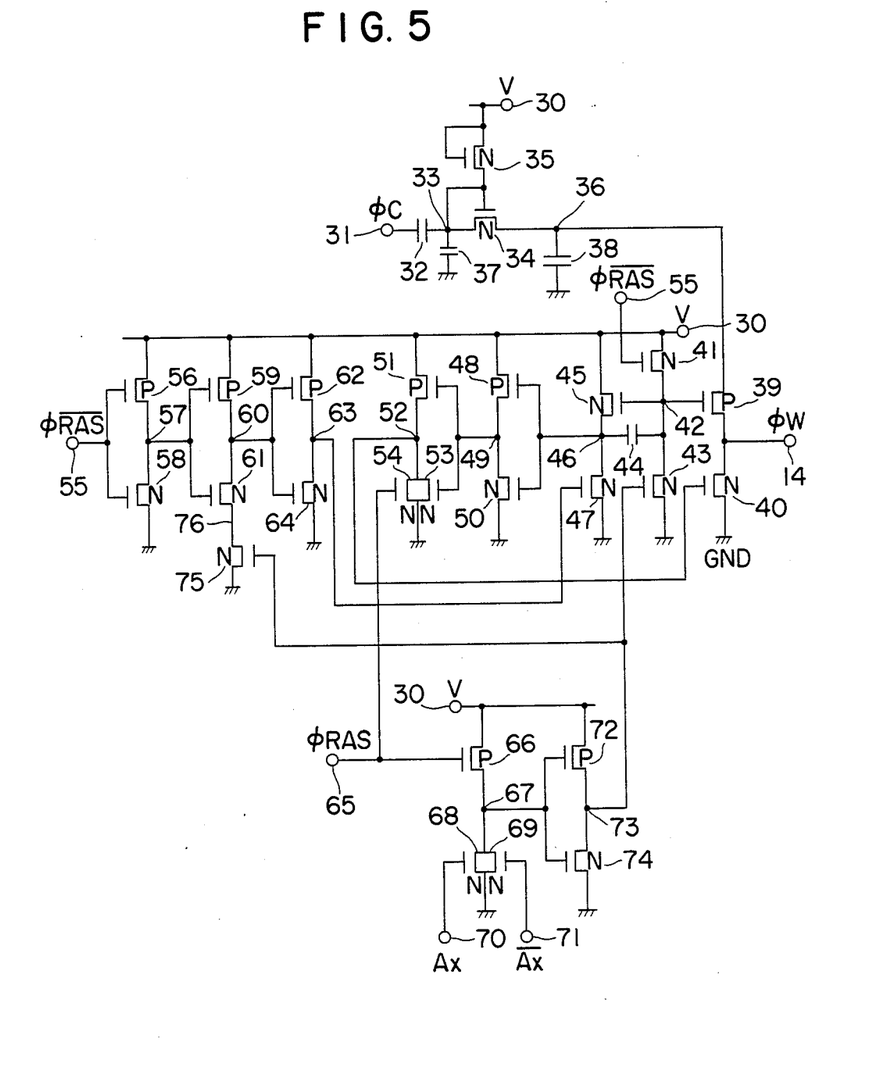
FIG. 5 is a circuit diagram showing a word line drive circuit according to an embodiment of this invention.

FIG. 5 is a circuit diagram showing a word line drive circuit according to a preferred embodiment of this invention. In FIG. 5, the same reference numerals as in FIGS. 1 and 3 denote identical or similar elements. The numeral 30 denotes a power supply terminal receiving a power supply voltage supplied from an external power supply, not shown. The numeral 31 denotes an input terminal provided to receive a periodical signal $\phi c$. The numeral 32 denotes a boosting capacitor connected between the input terminal 31 and a node 33. The numeral 34 denotes a rectifying FET, of which the drain and the gate are connected to the node 33 and the source is connected to a node 36. The numeral 35 denotes a charging FET, of which the drain and the gate are connected to the power supply terminal 30 and the source is connected to the node 33. The numeral 37 denotes a parasitic capacitance element, of which one electrode is connected to the node 33 and the other electrode is connected to the ground. The numeral 38 denotes a voltage stabilizing capacitor, of which one electrode is connected to the node 36 and the other electrode is connected to the ground.

The numeral 39 denotes a P-channel FET, of which the drain is connected to the output terminal 14, the source is connected to the node 36 (a first power supply terminal), and the gate is connected to a node 42. The numeral 40 denotes an N-channel FET, of which the drain is connected to the output terminal 14, the source is connected to the ground (a second power supply terminal), and the gate is connected to a node 52. The numeral 41 denotes an N-channel FET, of which the drain is connected to the power supply terminal 30 (a third power supply terminal), the source is connected to the node 42, and the gate is connected to a terminal 55. The numeral 43 denotes an N-channel FET, of which the drain is connected to the node 42, the source is connected to the ground, and the gate is connected to a node 73. The N-channel FETs 41 and 43 form a drive circuit which generates a control signal having a phase opposite to the signal on the output terminal 14, and applies the control signal to the gate of the P-channel FET 39. The numeral 45 denotes an N-channel FET, of which the drain is connected to the power supply terminal 30, the source is connected to a node 46, and the gate is connected to the node 42. The numeral 47 denotes an N-channel FET, of which the drain is connected to the node 46, the source is connected to the ground, and the gate is connected to a node 63. The N-channel FETs 45 and 47 form a circuit which provides the node 46 a control signal having the same phase as the signal at the node 42, i.e., having the opposite phase to the signal on the output terminal 14. The numeral 44 denotes a boosting capacitor, of which one electrode is connected to the node 42 and the other electrode is connected to the node 46. The numeral 48 denotes a P-channel FET, of which the drain is connected to a node 49, the source is connected to the power supply terminal 30, and the gate is connected to the node 46. The numeral 50 denotes an N-channel FET, of which the drain is connected to the node 49, the source is connected to the ground, and the gate is connected to the node 46. The numeral 51 denotes a P-channel FET, of which the drain is connected to a node 52, the source is connected to the power supply terminal 30, and the gate is connected to the node 49. The numeral 53 denotes an N-channel FET, of which the drain is connected to the node 52, the source is connected to the ground, and the gate is connected to the node 49. The numeral 54 denotes an N-channel FET, of which the drain is connected to the node 52, the source is connected to the ground, and the gate is connected to an input terminal 65, to which a clock signal $\phi RAS$ is supplied.

The numeral 56 denotes a P-channel FET, of which the drain is connected to a node 57, the source is connected to the power supply terminal 30, and the gate is connected to an input terminal 55 to which a clock signal $\phi \overline{RAS}$ is supplied. The numeral 58 denotes and N-channel FET, of which the drain is connected to a node 57, the source is connected to the ground, and the gate is connected to the input terminal 55. The numeral 59 denotes a P-channel FET, of which the drain is connected to a node 60, the source is connected to the power supply terminal 30, and the gate is connected to the node 57. The numeral 61 denotes an N-channel FET, of which the drain is connected to a node 60, the source is connected to a node 76, the gate is connected to the node 57. The numeral 75 denotes an N-channel FET, of which the drain is connected to the node 76, the source is connected to the ground, and the gate is connected to the node 73. The numeral 62 denotes a P-channel FET, of which the drain is connected to the node 63, the source is connected to the power supply terminal 30, and the gate is connected to the node 60. The numeral 64 denotes an N-channel FET, of which the drain is connected to the node 63, the source is connected to the ground, and the gate is connected to the node 60.

The numeral 66 denotes a P-channel FET, of which the drain is connected to a node 67, the source is connected to the source terminal 30, and the gate is connected to the input terminal 65. The numeral 68 denotes an N-channel FET, of which the drain is connected to the node 67, the source is connected to the ground, and the gate is connected to an input terminal 70, to which an address signal Ax is supplied. The numeral 69 denotes an N-channel FET, of which the drain is connected to the node 67, the source is connected to the ground, and the gate is connected to an input terminal 71, to which an address signal $\overline{Ax}$ is supplied. The numeral 72 denotes a P-channel FET, of which the drain is connected to the node 73, the source is connected to the power supply terminal 30, and the gate is connected to the node 67. The numeral 74 denotes an N-channel FET, of which the drain is connected to the node 73, the source is connected to the ground, and the gate is connected to the node 67.

The operation of this drive circuit will now be described with reference to FIGS. 6 and 7.

First, the operation of the boosting circuit which comprises the FETs 34 and 35, the parasitic capacitance element 37, and the boosting capacitor 32 is described. In the timing chart of FIG. 6, $\phi c$ represents a periodic signal to be supplied to the input terminal 31, which may be generated by a ring oscillator (not shown) for example, and V33 and V36 represent voltages of signals at the nodes 33 and 36, respectively.

Figure 6:
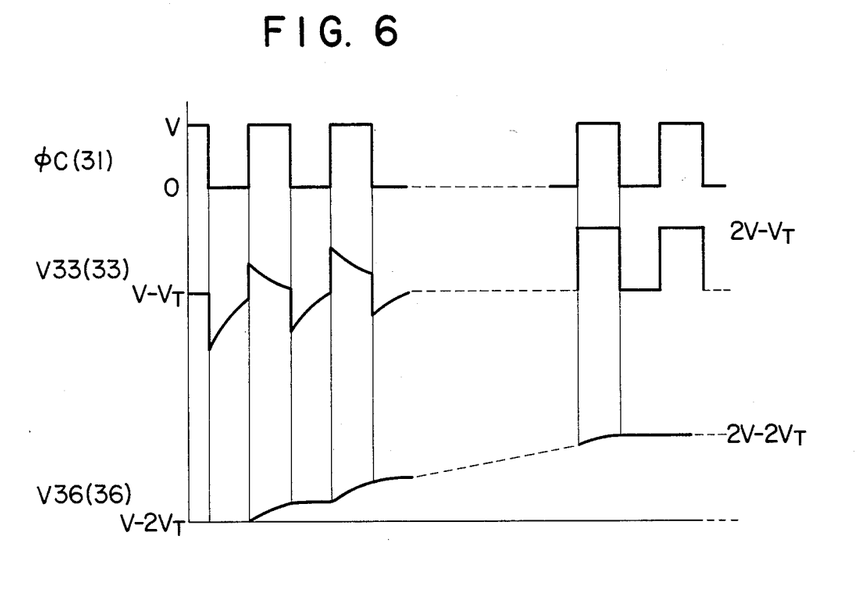
FIGS. 6 and 7 are timing charts illustrating the opperation of the circuit shown in FIG. 5.
Figure 7:
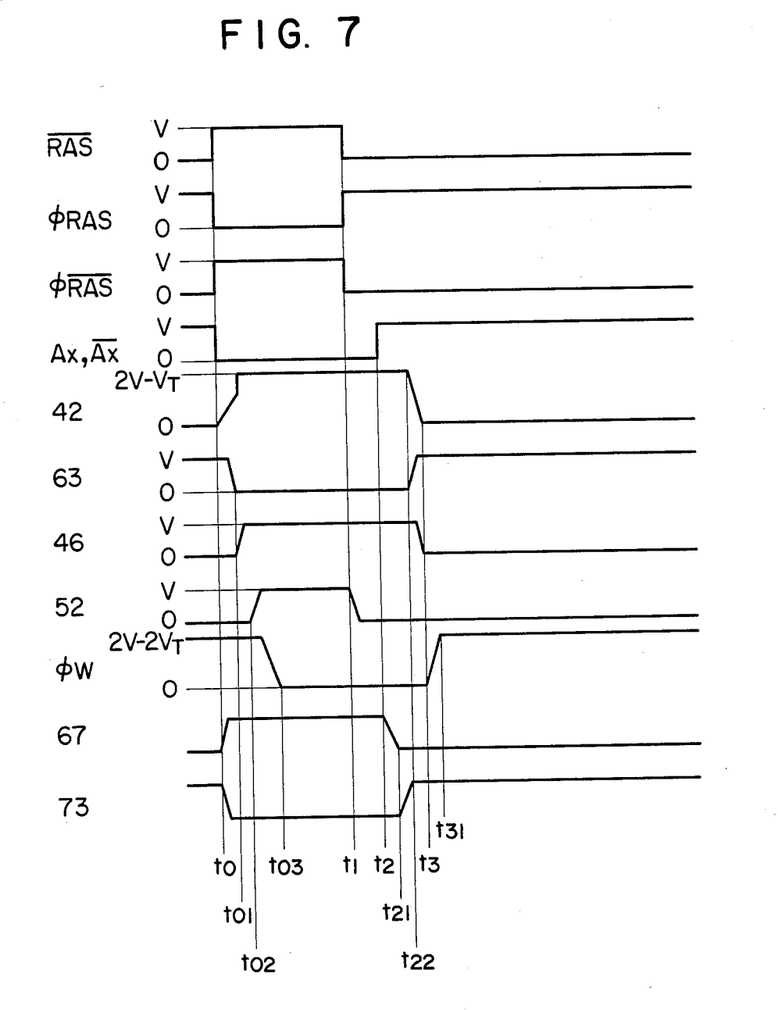

When a power supply voltage V is supplied to the power supply terminal 30, the nodes 33 and 36 are charged to the voltages $V-V_T$ and $V-2_T$ (where $V_T$ is a threshold voltage of each of FETs 34 and 35), respectively, through the charging FET 35 and the rectifying FET 34, and the oscillator provides the periodic signal $\phi c$ as is shown in FIG. 6. In the following description, the boosting is supposed to begin after the nodes 33 and 36 have reached the voltages $V-V_T$ and $V-2V_T$, respectively, and have been stabilized. This is for the sake of similicity of description: actually, the boosting begins immediately after the power supply voltage V has been supplied to the power supply terminal 30.

When the periodical signal $\phi c$ rises after the nodes 33 and 36 have reached the voltages $V-V_T$ and $V-2V_T$, respectively, charges are supplied to the node 36 through the rectifying FET 34, so that the voltage V36 at the node 36 increases by $\Delta V36$ which is given by $$\Delta V36 = \{C32/(32+C38)\}V,$$

where C32 is the capacitance of the capacitor 32 and C38 is the capacitance of the capacitor 38.

When the periodical signal $\phi c$ falls, the voltage V33 at the node 33 falls owing to the coupling through the capacitor 32, but the voltage V36 at the node 36 does not fall and keeps the value which it has had. This is because the rectifying FET 34, whose gate is connected to its drain, turns off when the voltage V33 falls.

The voltage V36 therefore gradually increases as the pulses of the periodical signal $\phi c$ are repeatedly supplied, as is shown in FIG. 6. The final voltage V33max at the node 33 is given by $$V33max = V - V_T + \{C33/(C32+C37)\}V$$

where C37 is the capacitance of the parasitic capacitance element 37. At the same time, the voltage V36 at the node 36 becomes a value lower than the voltage V33 by the threshold $V_T$ of the rectifying FET 34. That is, the final voltage V36max at the node 36 is represented by $$\begin{aligned} V36max &= V33max - V_T \\ &= V - 2V_T + \{C32/(C32+C37)\}V \end{aligned}$$

In a practical design of the circuit, the capacitance C32 of the capacitor 32 is readily made to be much greater than the capacitance C37 of the parasitic capacitance element 37, and the power supply voltage V is chosen to be 8 through 10 times greater than the threshold voltage $V_T$ of the FET. Therefore, supposing $V=8V_T$, the above equation is rewritten as follows:

$$V36max = V + 6V_T > V$$

That is, the final voltage V36max is greater than the power supply voltage V. This voltage level of V36max is kept by the stabilizing capacitor 38 which has a very large capacitance (several hundreds pF) and which is formed on the chip.

The operation of the other parts of the circuit particularly the operation during the precharging period t0−t1, and the period up to the time t2 when the drive signal rises, will now be described with reference to FIG. 7.

When the clock signal $\overline{RAS}$ turns from "0" to "1" (which represent the voltages of "0" and "V", respectively), the internal clock signal $\phi RAS$ and $\overline{\phi RAS}$ turn from "1" to "0" and from "0" to "1", respectively. One of the address signals Ax, $\overline{Ax}$ which is at "1" turns to "0".

When the clock signal $\overline{\phi RAS}$ turns from "0" to "1" at the time t0, the FET 41 turns on, so that the node 42 is charged to "1". Three serial connected inverter circuits comprising the FETs 56, 58, 59, 61, 62, 64 and 75 form a delay circuit and the output signal of this delay circuit at the node 63 turns from "1" to "0" at the time t01. This makes the FET 47 turn off, so that the level at the node 46 turns from "0" to "1". When the voltage at the node 46 rises from 0 to V, the voltage at the node 42 is pushed up to $2V-V_T$ by the action of the boosting capacitor 44, so that the FET 39 turns off because both of the source and the gate are at the voltage of $2V-V_T$. Two serial connected inverter circuits comprising the FETs 48, 50, 51, 53 and 54 form another delay circuit, and the signal at the node 46 is delayed by this delay circuit and outputted through the node 52. The level at the node 52 therefore turns from "0" to "1" at the time t02. This makes the FET 40 turn on, so that to drive signal $\phi w$ turns from "1" to "0" at the time t03.

By the action of the delay circuit comprising the FETs 48, 50, 51 and 53, it is ensured that the FET 40 is turned on after the FET 39 is turned off. This is to prevent a large current from flowing through the path comprising FETs 39 and 40 which would be formed if these FETs are concurrently conductive. If the current through the FETs 39 and 40 is not problematical, the gate of the FET 40 may be directly connected to the node 42, and the delay circuit comprising the FETs 48, 50, 51, 53 and 54 may be omitted.

By the series of operations during the time t0 through t03 described above, the drive signal $\phi w$ turns to "0". When the clock signal $\overline{RAS}$ turns from "1" to "0" at the time t1, the clock signal $\phi RAS$ turns from "0" to "1" and the clock signal $\overline{\phi RAS}$ turns from "1" to "0". When the clock signal $\phi RAS$ turns to "1", the FET 54 turns on and the level at the node 52 turns from "1" to "0", so that the FET 40 turns off.

When one of the address signals Ax, $\overline{Ax}$ turns from "0" to "1" at the time t2, the FET 68 or 69 turns on. This makes the level at the node 67 turn from "1" to "0" at the time t21, thereby turning on the FET 72 and turning off the FET 74, so that the level at the node 73 turns from "0" to "1" at the time t22.

When the level at the node 73 turns to "1", the FET 43 turns on, so that the level at the node 42 turns from "1" to "0". This makes the FET 39 turn on at the time t3 and the drive signal $\phi w$ rapidly rises to $2V-2V_T$ at the time t31.

According to this embodiment, as described above, the word line drive signal $\phi w$ can rise smoothly instead of stepwise as in the prior art, and the data reading speed can therefore be increased.

In the above described embodiment, the FET 75 has a functioin of preventing the FET 39 from turning on prior to the expected time. This function will now be described in further detail. When the level at the node 73 turns from "0" to "1", the FET 43 turns on, so that the level at the node 42 turns from "1" to "0". If the FET 75 were not provided the operation would be as follows. When the clock signal $\phi\overline{RAS}$ turns from "1" to "0", the level at the node 63, which is the output terminal of the delay circuit comprising FETs 56, 58, 59, 61, 62 and 64, may turn to "1" before the level at the node 73. If this happens, the FET 43 turns on before the FET 47. When the FET 47 turns on, the level at the node 46 turns from "1" to "0" and this voltage change lowers the level at the node 42 which is coupled with the node 46 through the capacitor 44. As a result, the gate voltage of the FET 39 (the voltage at the node 42) becomes lower than the power supply voltage at 36, i.e., the voltage at the source of the same FET 39, so that the FET 39 turns on and the drive signal $\phi w$ begins to rise prior to the expected time t31. This would cause erroneous operation of the memory.

Figure 8:
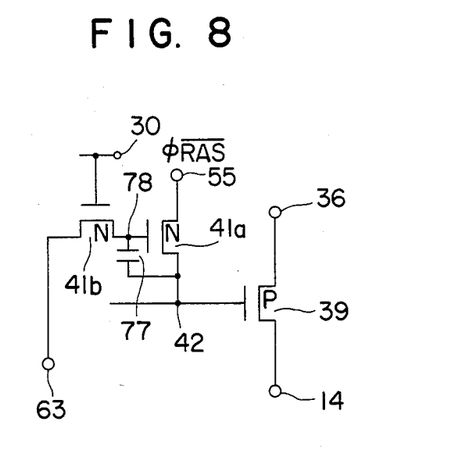
FIG. 8 is a circuit diagram showing a part of a word line drive circuit according to another embodiment of this invention.

FIG. 8 is circuit diagram showing a part of a word line drive circuit according to another embodiment of this invention. This embodiment is identical to the embodiment shown in FIG. 5 except that the FET 41 is replaced by the circuit shown in FIG. 8.

In FIG. 8, the numeral 41a denotes an N-channel FET, of which the drain is connected to the input terminal 55, the source is connected to the node 42, and the gate is connected to a node 78. The numeral 41b denotes an N-channel FET, of which the drain is connected to the node 63, the source is connected to the node 78, and the gate is connected to the power supply terminal 30. The numeral 77 denotes a boosting capacitor connected between the node 42 and the node 78.

Figure 9:
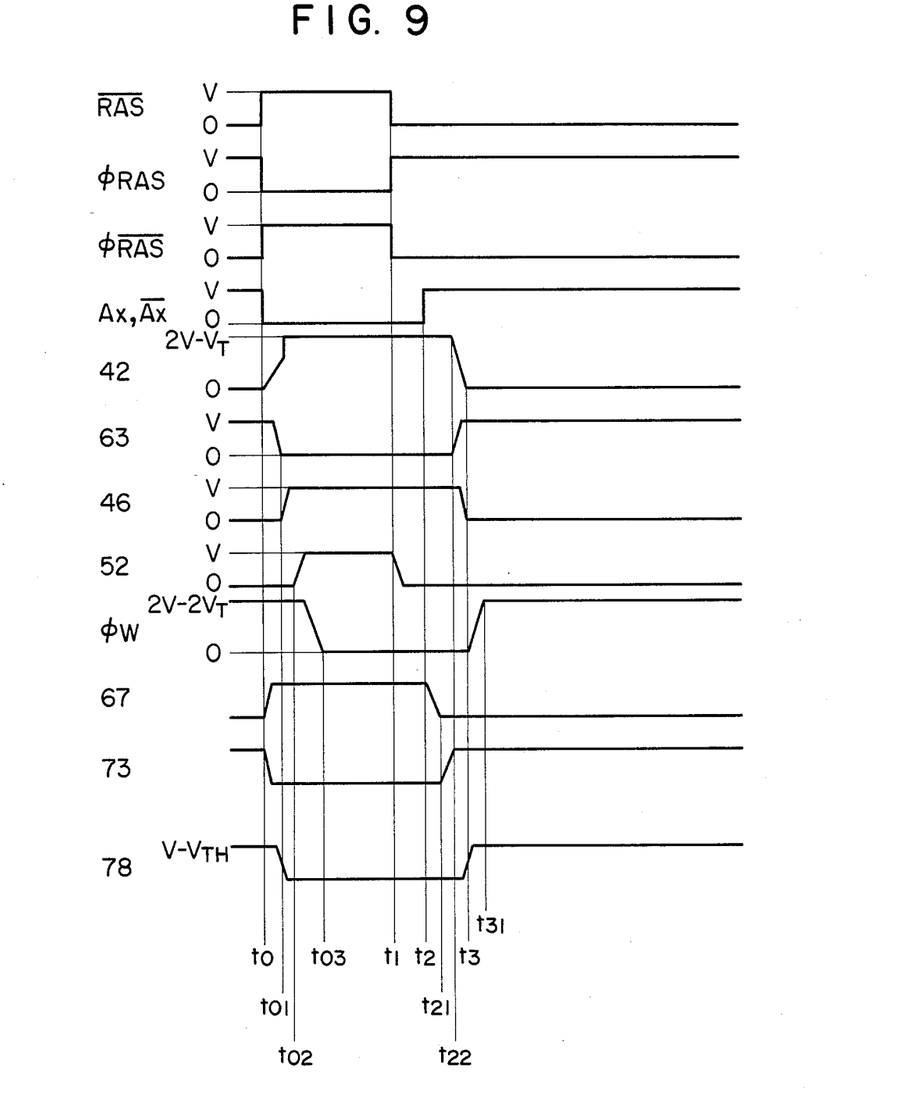
FIG. 9 is a timing chart illustrating the operation of the drive circuit incorporating the modification shown in FIG. 8.

The operation of this drive circuit will be described with reference to FIG. 9. Before the time t0, the node 78 has been charged to a voltage $V-V_{TH}$ because the voltage at the node 63 is at V, and hence the FET 41b, whose gate is at V is conductive. When the clock signal $\phi\overline{RAS}$ turns from "0" to "1", the level at the node 42 increases toward $\phi\overline{RAS}=V$ by a current through the FET 41a whose drain is connected to $\phi\overline{RAS}$. This voltage change is fed back to the node 78 through the capacitor 77, so that the voltage at the node 78 increases. Then, the voltage at the node 42 increases to V by the triode operation of FET 41a. Thus, the charging speed is increased. In contrast, in the circuit shown in FIG. 5, the FET 41 operates in a saturated region, so that the charging speed at the node 42 is low compared with the circuit of FIG. 8.

When, at the time t01, the FET turns on, the capacitor 77 is discharged through the FET 64, so that the level at the node 63 turns from "1" to "0", and the level at the node 78 falls to "0", so that the FET 41a, turns off. Subsequently, the FET 45 turns on, so that the node 46 rises to "V" and the level at the node 42 rises to $2V-V_T$. The level at the node is maintained even when $\phi\overline{RAS}$ falls to "0" at the time t1 because the FET 41a as well as the FET 43 is off.

As has been described, according to the embodiments of the invention, there is provided a P-channel FET having its source connected to a boosted voltage source and an N-channel FET connected in series with the P-channel FET, and a boosted voltage is applied to the gate of the P-channel FET to keep it nonconductive. When the boosted voltage to the gate of the P-channel FET is removed, the P-channel FET conducts and the boosted voltage at the source of the FET is delivered through the P-channel FET as a word line drive signal. Since the boosted voltage to the gate is removed by a single signal, the drive signal rises quickly.

When the gate length of a FET is reduced along with progress in the degree of integration, the power supply voltage must be reduced because of reduction in with withstand voltage of the FETs. In that case, it is a common practice to apply a 5 volt power supply voltage only to an input and an output parts of a RAM to facilitate connection to TTL circuits used as the peripheral circuits, and to apply lower voltage to other parts of the RAM, which is generated by a step-down circuit. In applying the invention to such a circuit, the 5 volt power supply voltage is supplied to the node 36 from an external power supply and the reduced voltage is supplied to the power supply terminal 30.

What is claimed is:

1. A drive circuit comprising
   a first FET and a second FET which are connected in series and between a first power supply terminal and a second power supply terminal, a junction of said first FET and said second FET being connected to an output terminal which provides a drive signal, and said first FET having an opposite conductivity to said second FET,
   a boosting capacitor having a first electrode connected to a gate of said first FET and a second electrode connected to a first node to which a first control signal is supplied, and
   drive means which generates a second control signal and supplies said second control signal to said gate of said first FET,
   said first control signal and said second control signal having a substantially inverse phase to the phase of said drive signal.

2. A drive circuit according to claim 1 further comprising a third FET and a fourth FET which are connected in series and between a third power supply terminal and said second power supply terminal, which supply said first control signal to said first node, and which have the same conductivity as said second FET.

3. A drive circuit according to claim 2 wherein said drive means further comprises a pair of FETs which are connected between said third power supply terminal and said second power supply terminal, and have the same conductivity as said second FET.

4. A word line drive circuit for a random access memory to provide a drive signal having a voltage greater than a voltage V supplied from an external power supply for said circuit, said circuit comprising
   a first power supply terminal and a second power supply terminal,
   means providing said first power supply terminal with a voltage greater than the voltage supplied from an external power supply, a first FET and a second FET which are connected in series and between said first power supply terminal and said second power supply terminal, a junction of said first FET and said second FET being connected to an output terminal at which said drive signal is produced and said first FET having an opposite conductivity to said second FET, a boosting capacitor having a first electrode connected to a gate of said first FET and a second electrode connected to a node to which a first control signal having a substantially inverse phase to that of said drive signal is supplied, and drive means which supplies a second control signal to said gate of said first FET, said second control signal having the same phase as that of said first control signal, and a voltage of said second control signal being increased by said boosting capacitor to a level sufficient to keep said first FET nonconductive.

5. A word line drive circuit according to claim 4 further comprising means supplying a third control signal to a gate of said second FET to keep said second FET nonconductive while the word line drive signal is to be produced.

6. A word line drive circuit according to claim 4 further comprising a third FET and a fourth FET which are connected in series and between a third power supply terminal connected to said external power supply and said second source terminal, a junction of said third FET and said fourth FET being connected to said node to supply said first control signal.

7. A word line drive circuit according to claim 6 wherein said third FET and said fourth FET have the same conductivity as said second FET.

8. A word line drive circuit according to claim 7 wherein said third FET is connected to receive, at its gate, said second control signal, and said fourth FET is connected to receive, at its gate, a delayed signal which has an inverse phase, with a certain delay, to that of said second signal.

9. A word line drive circuit according to claim 4 wherein said drive means comprises a pair of FETs which are connected in series and between said third source terminal connected to an external power supply and said second source terminal, a junction between said pair of FETs being connected to said gate of said first FET to supply said first control signal.

10. A word line drive circuit according to claim 9 wherein said pair of FETs have the same conductivity as said second FET.

11. A word line drive circuit according to claim 4 wherein said third control signal has the same phase, with a certain dealy, as that of said second signal.

* * * * *